(12) United States Patent
Choi

(10) Patent No.: US 9,356,256 B2
(45) Date of Patent: May 31, 2016

(54) FLEXIBLE DISPLAY DEVICE AND MANUFACTURING METHOD THEREOF

(71) Applicant: Samsung Display Co., Ltd., Yongin, Gyeonggi-Do (KR)

(72) Inventor: Jung-Ho Choi, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/446,773

(22) Filed: Jul. 30, 2014

(65) Prior Publication Data

US 2015/0034935 A1    Feb. 5, 2015

(30) Foreign Application Priority Data

Jul. 31, 2013  (KR) .......................... 10-2013-0091091
Aug. 23, 2013  (KR) .......................... 10-2013-0100541

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ........ *H01L 51/5253* (2013.01); *H01L 51/0097* (2013.01); *H01L 27/3223* (2013.01); *H01L 27/3246* (2013.01); *H01L 51/56* (2013.01); *H01L 2227/323* (2013.01); *H01L 2251/5338* (2013.01); *H01L 2251/566* (2013.01)

(58) Field of Classification Search
CPC ............ H01L 27/3246; H01L 27/3223; H01L 51/0097; H01L 51/56; H01L 51/5253; H01L 2227/323; H01L 2251/5338
See application file for complete search history.

(56) References Cited

U.S. PATENT DOCUMENTS

| | | | |
|---|---|---|---|
| 8,241,713 B2* | 8/2012 | David et al. ................... | 427/578 |
| 8,247,809 B2* | 8/2012 | Kim ................................ | 257/40 |
| 8,461,760 B1* | 6/2013 | Oh et al. ....................... | 313/512 |
| 8,624,230 B2* | 1/2014 | Um et al. ....................... | 257/40 |
| 8,624,247 B2* | 1/2014 | Choi .............................. | 257/59 |

(Continued)

FOREIGN PATENT DOCUMENTS

| | | |
|---|---|---|
| KR | 10-0777746 B | 11/2007 |
| KR | 10-0796129 B | 1/2008 |

(Continued)

*Primary Examiner* — Ida M Soward
(74) *Attorney, Agent, or Firm* — Innovation Counsel LLP

(57) ABSTRACT

A flexible display device includes: a display substrate which is divided into a first region corresponding to a within-cell region of an integrated devices sheet from which the flexible display device is cut and into a second region corresponding to an outside-the-cell region of the integrated devices sheet, where within the first region there is provided a display unit including a light emitting element layer; a patterned inorganic film layer formed to be substantially continuously present within the first region of the display substrate and to be not present or not substantially continuously present within the second region of the display substrate; and a thin film encapsulation layer formed on the inorganic film layer to encapsulate the substantially continuously present portion of the inorganic film layer that is within the first region and the display unit, wherein an outer boundary of the thin film encapsulation layer is located more inwardly and toward an outer boundary of the display unit than is an outer boundary of the substantially continuously present portion of the inorganic film layer.

19 Claims, 21 Drawing Sheets

(56) References Cited

U.S. PATENT DOCUMENTS

| | | | |
|---|---|---|---|
| 8,772,818 B2 * | 7/2014 | Klein et al. | 257/99 |
| 8,772,824 B2 * | 7/2014 | Lee et al. | 257/100 |
| 8,836,216 B2 * | 9/2014 | Kwack et al. | 313/512 |
| 8,921,835 B2 * | 12/2014 | Lee | H01L 29/78603 257/40 |
| 2005/0179379 A1 * | 8/2005 | Kim | H05B 33/04 313/512 |
| 2008/0278070 A1 * | 11/2008 | Kim | G06F 3/0412 313/504 |
| 2011/0134018 A1 * | 6/2011 | Seo | H01L 51/003 345/76 |
| 2012/0070942 A1 * | 3/2012 | Fedorovskaya et al. | 438/127 |
| 2012/0235171 A1 * | 9/2012 | Kim | H01L 51/5253 257/88 |
| 2012/0267646 A1 * | 10/2012 | Kim | H01L 51/5253 257/88 |
| 2013/0168712 A1 * | 7/2013 | Jeong | H01L 51/5275 257/98 |
| 2014/0021856 A1 * | 1/2014 | Jung et al. | 313/504 |
| 2014/0050933 A1 * | 2/2014 | Kim et al. | 428/457 |
| 2014/0138634 A1 * | 5/2014 | Lee et al. | 257/40 |
| 2014/0138641 A1 * | 5/2014 | Yi | H01L 27/3244 257/40 |
| 2014/0145979 A1 * | 5/2014 | Lee | G06F 3/0412 345/173 |

FOREIGN PATENT DOCUMENTS

| | | |
|---|---|---|
| KR | 10-0906716 B | 7/2009 |
| KR | 10-2012-0042151 A | 5/2012 |

* cited by examiner

FLEXIBLE DISPLAY DEVICE AND MANUFACTURING METHOD THEREOF

RELATED APPLICATIONS

This application claims priority to and the benefit of Korean Patent Application Nos. 10-2013-0091091 and 10-2013-0100541 respectively filed in the Korean Intellectual Property Office on Jul. 31, 2013 and Aug. 23, 2013, the entire contents of which applications are incorporated herein by reference.

BACKGROUND

1. Field

The present disclosure of invention relates generally to a flexible display device and a manufacturing method thereof. More particularly, the described technology relates to a flexible substrate portion of a flexible display device and a manufacturing method thereof.

2. Description of Related Technology

An organic light emitting diodes (OLED) display that uses as its post-production base, a flexible substrate like a plastic film instead of a rigid substrate like glass can be mass-produced to have desirable flexibility characteristics as opposed to brittle characteristics. That is, the flexible OLED display includes a plastic film as its base, a plurality of pixel circuits, and a plurality of organic light emitting diodes monolithically integrally formed on the flexible plastic film base.

In a mass production process of manufacturing the flexible display device, the plastic film is typically and temporarily disposed on a rigid carrier substrate such as glass while the pixel circuits and the organic light emitting diodes are formed on the plastic film. Then the rigid carrier substrate and the flexible plastic film are separated from each other. In other words, during mass production, the plastic film is supported by the carrier substrate so as to be maintained in a flat state during the manufacturing process. But afterwards, the two are peeled apart or otherwise separated.

More specifically, plural ones of the plastic film substrates or an integrated unity of them is formed on the rigid carrier substrate such that the latter serves as a mother substrate that allows for simultaneous mass production manufacture of a plurality of flexible display devices. The rigid carrier substrate and the flexible plastic film may be diced (cut) into individualized units before or after separation of the carrier substrate and the plastic film, to thereby produce individual flexible display devices.

However, in a case where the plastic film substrates first originate as one continuous, mother plastic film that is cut (diced) only after the mother carrier substrate and the mother plastic film have been separated from each other, deformation of display areas and other errors may be caused due to physical impacts produced during the dicing (the cutting apart of the individual units).

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

Provided is a flexible display device and a manufacturing method thereof having a feature of preventing or inhibiting a spreading of cracks from a cut line of the mother plastic film to a display area of the corresponding, individual flexible display device, where the crack-spread inhibiting/preventing feature may be obtained by removing from an outside-the-cell region at least parts of an inorganic film layer and/or forming a dummy pattern layer in the outside-the-cell region in which there is present the cell cutting line of a one-sheet integration (the mother plastic film) of a plurality of such display devices.

An exemplary embodiment provides a flexible display device including: a display substrate which is divided into a first region corresponding to a within-display-cell region of an integrated devices sheet (the mother plastic film)) out of which the individualized flexible display device is cut out and a second region corresponding to an outside-the-cell region of the integrated devices sheet, where the first region provides a corresponding, individualized display unit including a light emitting element layer; a patterned inorganic film layer formed to be substantially continuously present within the first region of the display substrate and to be not present or to be substantially not continuously present within the second region of the display substrate; and a thin film encapsulation layer formed on the inorganic film layer so as to encapsulate the substantially continuously present portion of the inorganic film layer that is within the first region. In other words, an outer boundary of the thin film encapsulation layer is patterned so as to be located between an outer boundary of the display unit and an outer boundary of the substantially continuously present portion of the inorganic film layer such that nascent cracks generated at the cut line cannot easily propagate to become cracks extending into the operational regions of the individualized flexible display device.

The inorganic film layer may include: a barrier layer formed on the cell region of the display substrate; a gate insulating layer formed on the barrier layer; and a inter layer dielectric formed on the gate insulating layer.

A cell cutting line may be located in the cell outer region, the display substrate being cut according to the cell cutting line, and a dummy pattern layer may be formed between an outer boundary of the inorganic film layer and the cell cutting line.

The dummy pattern layer may be formed of the same material as that of the barrier layer.

The dummy pattern layer may be formed in a pattern of a so-called, Rias dam (one having a wavy outer coastline) with respect to the cell cutting line.

The dummy pattern layer may include a plurality of spaced apart dummy pattern layers which are disposed at a predetermined distance from each other.

Another embodiment provides a flexible unit display device obtained by dividing a plurality of flexible unit display devices which are integrally formed, including: a unit display substrate divided into a within-cell region and an outside-the-cell region; a display unit formed within the within-cell region of the unit display substrate and including an organic light emitting element including a pixel electrode, an organic light emission layer, and a common electrode which are formed on the unit display substrate; an inorganic film layer formed to have an outer boundary ending at an end portion of, or within the within-cell region of the unit display substrate; and a thin film encapsulation layer configured to cover and encapsulate the inorganic film layer and the organic light emitting element, wherein a higher cross-sectional portion of the thin film encapsulation layer is located between the boundary of the display unit and the boundary of the inorganic film layer.

The inorganic film layer may include: a barrier layer formed at an end portion of the cell region of the unit display substrate; a gate insulating layer formed on the barrier layer; and a inter layer dielectric formed on the gate insulating layer.

The flexible unit display device may further include a dummy pattern layer formed in the outside-the-cell region of the unit display substrate.

The dummy pattern layer may be formed of the same material as that of the barrier layer.

The dummy pattern layer may be formed in a pattern of a Rias dam with respect to an end portion of the cell outer region.

The dummy pattern layer may include a plurality of spaced apart dummy pattern layers which are disposed at a distance from each other.

Yet another embodiment provides a manufacturing method of a flexible display device, including: preparing a display substrate which is divided into within-cell region and a cell outer region other than the cell region, a display unit including a light emitting element layer being formed on the within-cell region; forming an inorganic film layer that blanket covers the within-cell region and the cell outer region of the display substrate; removing parts of the inorganic film layer that are on the cell outer region of the display substrate; and forming a thin film encapsulation layer formed on the inorganic film layer of the within-cell region of the display substrate.

The inorganic film layer may include: a barrier layer formed on the cell region of the display substrate; a gate insulating layer formed on the barrier layer; and a inter layer dielectric formed on the gate insulating layer.

The removing the inorganic film layer may include: disposing an etching mask which exposes an inorganic film layer formed on the cell outer region of the display substrate; and etching the exposed inorganic film layer.

The removing the inorganic film layer may include: disposing a first etching mask which exposes an inorganic film layer formed on the cell outer region of the display substrate; and first etching a gate insulating layer and an inter layer dielectric of the exposed inorganic film layer formed on the cell outer region of the display substrate.

The removing the inorganic film layer may further include: disposing a second etching mask which exposes the barrier layer on the barrier layer formed on the cell outer region of the display substrate; and second etching the exposed barrier layer.

The second etching mask may be formed in a pattern of a Rias dam with respect to a cell cutting line for cutting the display substrate, which is formed on the cell outer region.

The second etching mask may be provided to expose a part of the barrier layer formed on the cell outer region.

A method of inhibiting a spreading of cracks during cutting of a sheet of integrated flexible display devices (e.g., a mother plastic film having disposed thereon a plurality of individualizable flexible display devices) where the cutting of the sheet forms the individualized flexible display devices comprises: impeding the spread of cracks generated during the cutting by providing crack propagation gaps in materials that could otherwise spread the cracks where the crack propagation gaps are disposed between a cut line of the cutting process and at least one adjacent flexible display device: and impeding the spread of cracks generated during the cutting by providing one or more crack energy absorbing features that are spaced apart from and interposed between the cut line of the cutting process and at least one adjacent flexible display device.

In accordance with the exemplary embodiments, it is possible to cut off or impede the transfer of cracks to the display area through the inorganic film layer and to thus prevent physical damage to the display device including the inorganic film layer caused by external impact generated in the cutting of a one-sheet substrate. When the dummy pattern is present, it can help remove most of the cracks by absorbing their energies within the dummy pattern and can help prevent the remaining cracks from being transferred (propagated) to the display area

DETAILED DESCRIPTION

Figure 1:
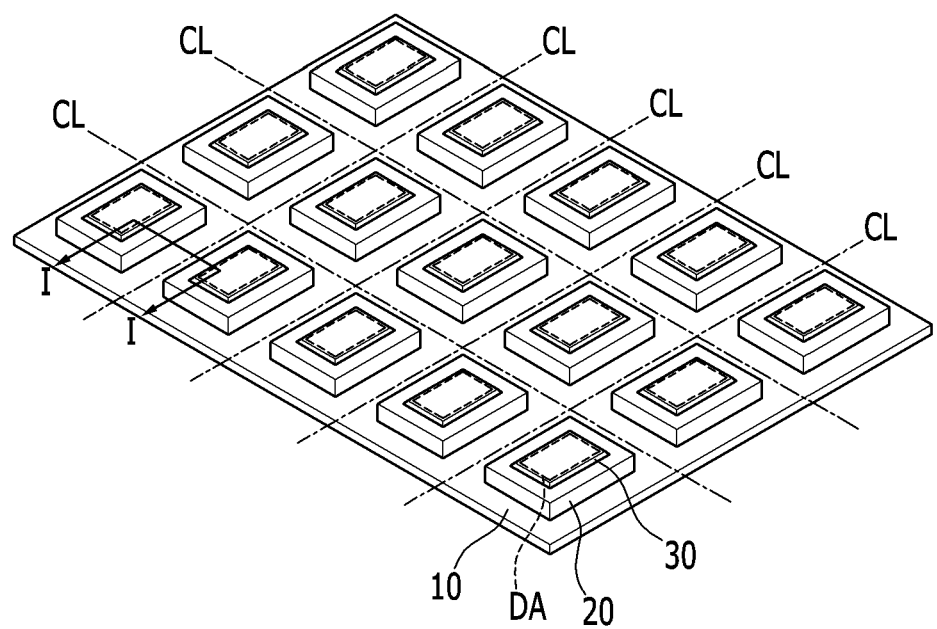
FIG. 1 is a perspective view showing a combination of plural flexible display devices disposed on a unitary and flexible mother substrate (e.g., a unitary plastic film that has already been separated from a rigid mother carrier) before cells thereof are subdivided (individualized via cutting) in accordance with an exemplary embodiment.

Hereinafter, exemplary embodiments will be described in detail with reference to the attached drawings such that the present disclosure of invention can be easily put into practice by those skilled in the art. As those skilled in the art would realize in view of this disclosure, the described embodiments may be modified in various different ways, all without departing from the spirit or scope of the present teachings.

In addition, in various exemplary embodiments, the same constituent elements are denoted by the same reference numerals and are representatively described in an exemplary embodiment, and different elements from the elements of the exemplary embodiment are described in other exemplary embodiments.

The drawings are schematic and are not illustrated in accordance with a scale. The relative sizes and ratios of the parts in the drawings are exaggerated or reduced for clarity and convenience in the drawings, and the arbitrary sizes are only exemplary and are not limiting. The same structures, elements, or parts illustrated in no less than two drawings are denoted by the same reference numerals in order to represent similar characteristics. When a part is referred to as being "on" another part, it can be directly on the other part or intervening parts may also be present.

Exemplary embodiments are not illustrated in full detail. As a result, various modifications are expected to be made. Therefore, the exemplary embodiments are not limited to a specific shape of an illustrated region, but, for example, include changes in the shape in accordance with manufacturing.

A flexible display device in accordance with an exemplary embodiment will now be described with reference to FIG. 1 to FIG. 5.

Figure 2:
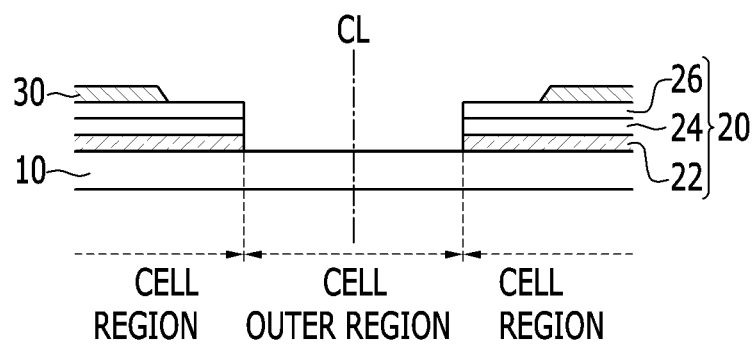
FIG. 2 is a cross-sectional view showing a structure of an exemplary pair of the flexible display devices taken along a line I-I of FIG. 1.
Figure 3:
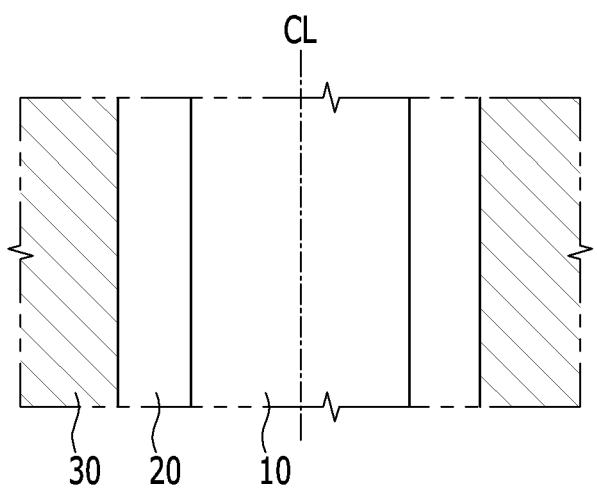
FIG. 3 is a top plan view schematically showing a portion of the flexible display devices when in the one-sheet state before cells thereof are cut in accordance with the present exemplary embodiment.
Figure 5:
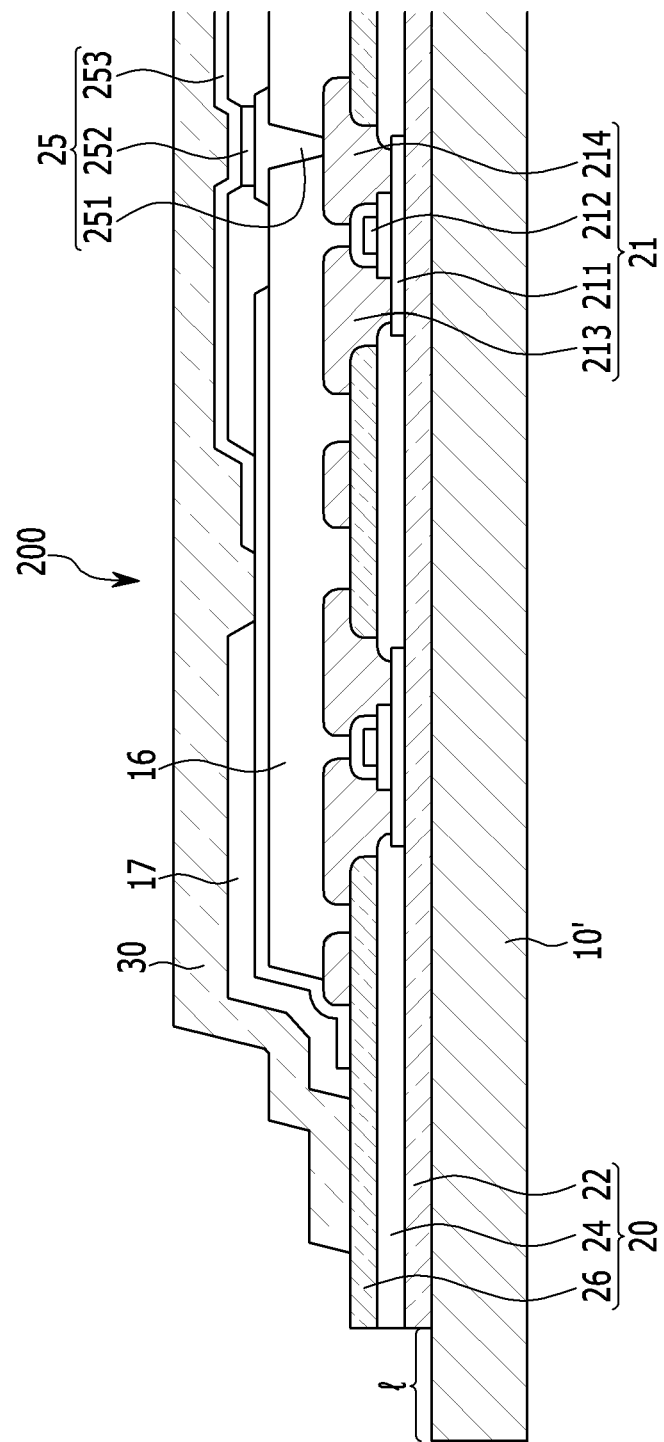
FIG. 5 is a cross-sectional view showing a structure of a flexible unit display device in accordance with the present exemplary embodiment.

FIG. 1 is a perspective view showing an integrated set of flexible display devices which are in a one-sheet state before individual cells thereof are cut apart in accordance with an exemplary embodiment. FIG. 2 is a cross-sectional view showing a structure of the flexible displays integrated device taken along a line I-I of FIG. 1. FIG. 3 is a plan view schematically showing the integrated set of flexible display devices which are in a one-sheet state before cells thereof are cut apart into the individualized the flexible unit display devices in accordance with the present exemplary embodiment. FIG. 5 is a cross-sectional view showing a structure of part of the flexible unit display in accordance with the present exemplary embodiment.

Figure 4:
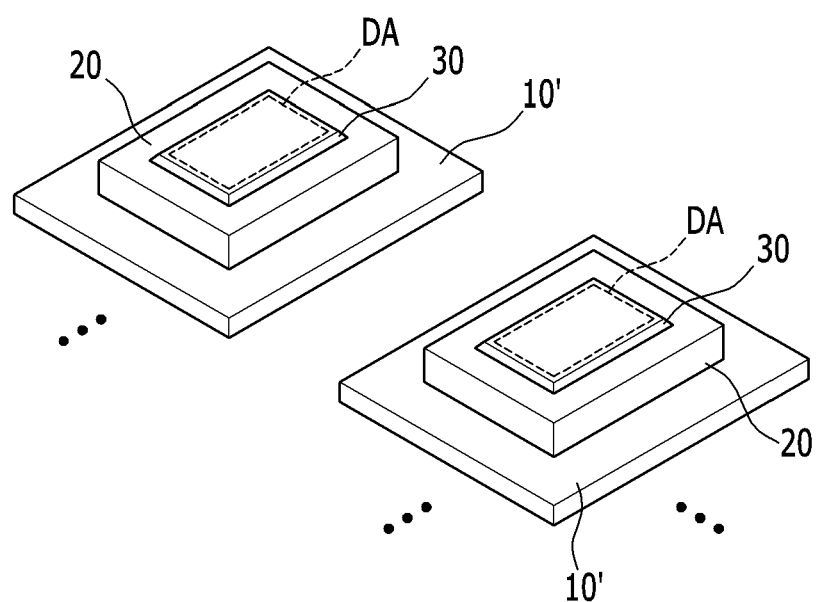
FIG. 4 is a perspective view schematically showing the individualized flexible unit display devices after the flexible one-sheet configuration is divided by cutting it in accordance with the present exemplary embodiment.

Referring to FIG. 1 to FIG. 3, for the flexible displays integrated device of the present exemplary embodiment, the display devices are provided in the one-sheet state after having been mass produced together so that the plurality of flexible display devices can be simultaneously processed in assembly line fashion and then afterwards cut apart according to a plurality of predetermined cell cutting lines CL so as to be individually divided into respective individualized unit flexible display devices (see FIG. 4). The unitary and flexible display substrate 10 (flexible mother substrate) may be formed of a flexible plastic film formed by curing a polymer material such as polyimide (PI) or polycarbonate (PC). For example, during the mass production process, the display substrate 10 is supported on a more rigid carrier substrate (not shown) and then the flexible mother substrate and the rigid carrier substrate (not shown) are separated apart.

More specifically, in FIGS. 1 to 3, the flexible display device of the present exemplary embodiment includes the pre- or post-dicing display substrate 10, a patterned inorganic film layer 20 formed on the display substrate 10, and a patterned thin film encapsulation layer 30 formed on the inorganic film layer 20. The display substrate 10 is divided into cell regions with each of individualizable display units DA each including a light emitting elements layer and cell outer regions other than the cell regions in which no display area is provided. The cell outer regions (see FIG. 2) may also be referred to as outside-the-cell regions. The predetermined cell cutting lines CL are located at substantially the center of the cell outer regions, midway between the adjacent cells and are used as guides to facilitate cutting and dividing of the one-sheet displays integrated device into individual unit display devices.

The inorganic film layer 20 is formed in each cell region of the display substrate 10. The inorganic film layer 20 may include a barrier layer 22 which is formed in the cell region of the display substrate 10, a gate insulating layer 24 formed on the barrier layer 22, and a inter layer dielectric 26 formed on the gate insulating layer 24.

The barrier layer 22 serves to prevent penetration of foreign elements (e.g., moisture and oxygen) into the interior of the display unit DA and to planarize a surface thereof, and may be formed of various materials. For example, the barrier layer 22 may include at least one of a silicon nitride ($SiN_x$) film, a silicon dioxide ($SiO_2$) film, and a silicon oxynitride ($SiO_xN_y$) film. However, the barrier layer 22 is optional and may be omitted depending on types of the display substrate and process conditions.

Referring to FIG. 4 and FIG. 5, the individualized flexible unit display device that is obtained by dividing a sheet full of plural flexible unit display devices which are integrally formed, as shown in FIG. 1 to FIG. 3, includes: a post-cutting unit display substrate 10' formed by division and divided into a within-cell region and a cell outer region other than the cell region; a display unit DA (or 200) formed within the cell region of the post-dicing unit display substrate 10' and including an organic light emitting elements layer 25 including a pixel electrode 251, an organic light emission layer 252, and a common electrode 253 which are formed on the unit display substrate 10' in that order and as shown in FIG. 5. The individualized flexible unit display device further includes the patterned inorganic film layer 20 formed at an end portion of the cell region of the unit display substrate 10'; and a thin film encapsulation layer 30 configured to cover and encapsulate the inorganic film layer 20 and the organic light emitting element 25. As indicated in the cross-sectional view of FIG. 5, as well as in the perspective view of FIG. 4, the outer boundary of the thin film encapsulation layer 30 is laterally disposed in between the outer boundaries of the display unit display areas DA and between the outer boundary of the inorganic film layer 20.

A driving semiconductor layer 211 is formed on the barrier layer 22 of the display unit DA. The driving semiconductor layer 211 includes a channel region which is formed of a polysilicon film, and a source region and a drain region which are formed at opposite sides of the channel region. In this case, a doped ion material is a P-type impurity such as boron (B), and $B_2H_6$ is mainly used as the doped ion material. Such an impurity is determined depending on types of the thin film transistor. The doped ion material may be an N-type impurity such as arsenic (As). In other words, the source region and the drain region may be doped as P-type or N-type to be PMOS or NMOS transistor.

The gate insulating layer 24 is also formed to a predetermined height on the barrier layer 22 by deposition. More specifically, the gate insulating layer 24 covers the driving gate electrode 212 of the thin film transistor in the display unit DA (or 200), and has respective through-holes formed therethrough to respectively expose the source region and the drain region of the driving semiconductor layer 211. Data wiring including a driving source electrode 213 and a driving drain electrode 214 is formed on the gate insulating layer 24. The driving source electrode 213 and the driving drain electrode 214 are respectively connected to the source region and the drain region of the TFT via the though holes.

A thin film transistor (TFT) 21 as shown in FIG. 5 is the OLED driving thin film transistor of the pixel circuit where the latter further includes a switching thin film transistor (not shown) and a storage capacitor which is also not shown. The switching thin film transistor serves as a switch for selecting a target pixel for receiving a light emission value signal, and the driving thin film transistor applies the corresponding power to the target pixel to allow the pixel to emit the amount of light indicated by the light emission value signal. Herein, a pixel may be considered as a minimum unit for light emission in a given wavelength range (color) to enable display of an image.

The gate insulating layer 24 is made of a ceramic-based material such as a silicon nitride ($SiN_x$) or a silicon oxide (SiOx).

The further inter layer dielectric 26 is formed on the gate insulating layer 24. The further inter layer dielectric 26 serves to cover the data wiring and to remove steps, and its added planarization helps to improve luminous efficiency of the organic light emitting element of the light emitting element layer 25. Further, the inter layer dielectric 26 has electrode contact holes which expose a part of the driving drain electrode 214. The light emitting elements layer 25 includes the pixel electrode 251 connected to the drain electrode 214 through a respective one of the contact holes, the organic light emission layer 252 formed on the pixel electrode 251, and the common electrode 253 for covering a plurality of organic light emission layers 252. A pixel definition film 17 is located between the pixel electrode 251 and the common electrode 253, and the organic light emission layer 252 is formed in a respective opening of the pixel definition film 17.

One of the pixel electrode 251 and the common electrode 253 may be formed as a reflective layer, and the other electrode may be formed of a translucent (e.g., semi-reflective) film or a transparent conductive film. Light emitted from the organic light emission layer 252 is reflected by the reflective layer and travels through the translucent film or the transparent conductive film, and is then discharged to the outside. In a case where the other electrode is the translucent film, some of the light discharged from the organic light emission layer 252 is re-reflected to the reflective layer to form an optically resonant structure. In this case, the common electrode 253 is formed of a translucent film and the pixel electrode 251 is formed of a reflective layer.

The inter layer dielectric 26 may be formed by using at least one material of a polyacrylate resin, an epoxy resin, a phenolic resin, a polyamide resin, a polyimide resin, an unsaturated polyester resin, a poly(phenylene ether) resin, a poly(phenylene sulfide) resin, and benzocyclobutene (BCB).

The thin film encapsulation layer 30 is formed on the inter layer dielectric 26 to encapsulate the inorganic film layer 20 and the display unit DA (or 200). A cross-sectional surface of the thin film encapsulation layer 30 is located between the display unit and that of the inorganic film layer 20 (i.e., a cross-sectional surface of the thin film encapsulation layer 30 is located more toward the display unit than that of the inorganic film layer 20). The boundary of the thin film encapsulation layer 30 is spaced apart from the boundary of the inorganic film layer 20 toward the display unit 200 (not to be expanded beyond the boundary of the inorganic film layer 20). Further, the thin film encapsulation layer 30 may be formed by alternately forming at least one organic layer and at least one inorganic layer. The inorganic layer or the organic layer may be provided in plural.

The organic layer is formed of a polymer, and preferably, may be at least one layer or a laminated layer formed of any one of polyethylene terephthalate, a polyimide, a polycarbonate, an epoxy, a polyethylene, and a polyacrylate. More preferably, the organic layer may be formed of a polyacrylate, and specifically, it includes a material of a monomer composition including a diacrylate-based monomer and a triacrylate-based monomer that are polymerized. A monoacrylate-based monomer may be further included in the monomer composition. Further, a known photoinitiator such as TPO may be further included in the monomer composition, but is not limited thereto.

The inorganic layer may be a single layer or a laminated layer including a metal oxide or a metal nitride. Specifically, the inorganic layer may include at least one of $SiN_x$, $Al_2O_3$, $SiO_2$, and $TiO_2$.

The uppermost layer of the thin film encapsulation layer 30, which is exposed to the outside, may be formed of the inorganic layer in order to prevent permeation of moisture and/or oxygen into the organic light emitting diode.

The thin film encapsulation layer 30 may include at least one sandwich structure in which at least one organic layer is inserted between at least two inorganic layers. Further, the thin film encapsulation layer 30 may include at least one sandwich structure in which at least one inorganic layer is inserted between at least two organic layers.

The thin film encapsulation layer 30 may sequentially include a first inorganic layer, a first organic layer, and a second inorganic layer in order from top to bottom of the display unit DA (or 200). Further, the thin film encapsulation layer 30 may sequentially include a first inorganic layer, a first organic layer, a second inorganic layer, a second organic layer, and a third inorganic layer in order from top to bottom of the display unit DA (or 200). Further, the thin film encapsulation layer 30 may sequentially include a first inorganic layer, a first organic layer, a second inorganic layer, a second organic layer, a third inorganic layer, a third organic layer, and a fourth inorganic layer in order from top to bottom of the display unit DA (or 200).

Additionally, a metal halide layer including LiF may be included between the display unit DA (or 200) and the first inorganic layer. The metal halide layer may serve to prevent the display unit DA (or 200) from being damaged when the first inorganic layer is formed according to a sputtering method or a plasma deposition method.

The first organic layer is narrower than the second inorganic layer, and the second organic layer may be narrower than the third inorganic layer. Further, the first organic layer is entirely covered by the second inorganic layer, and the second organic layer may be entirely covered by the third inorganic layer.

As shown in FIG. 1 to FIG. 5, the flexible display device of the present exemplary embodiment is patterned to inhibit or prevent cracks from being transferred (propagated) from the mother cut-line to the display area by propagation through the inorganic film layer due to an impact generated when the one-sheet display device is cut (diced). In a first instance, such crack propagation through the inorganic film layer is prevented by not having an inorganic film layer (or a continuum thereof) in the cell outer region unlike the conventional flexible display device where the inorganic film layer is present as a continuum and thus serves as a conduit for propagating cracks. More specifically, it has been recognized here that when cutting occurs along the cut lines CL of the mother substrate (10), the applied strains of the cutting apparatus (e.g., knife edge) may generate nascent cracks which extend roughly perpendicular to or otherwise inclined relative to the cut lines CL and that these nascent cracks can grow over time and later extend by way of crack propagation through crackable materials. However, if there are sufficiently large intervals of only noncrackable material (e.g., flexible plastic) between islands of crackable materials (e.g., those of the inorganic film layer 20) then crack propagation can be stopped or substantially inhibited. Additionally, if there are stress energy absorbing interfaces interposed between the cut line CL and the outer boundary of the crackable materials layer (e.g., the inorganic film layer 20) of each cell, that too may help to stop or inhibit the propagation of cracks into the crackable materials layers (e.g., the inorganic film layers 20) of adjacent and being individualized cells.

Figure 6:
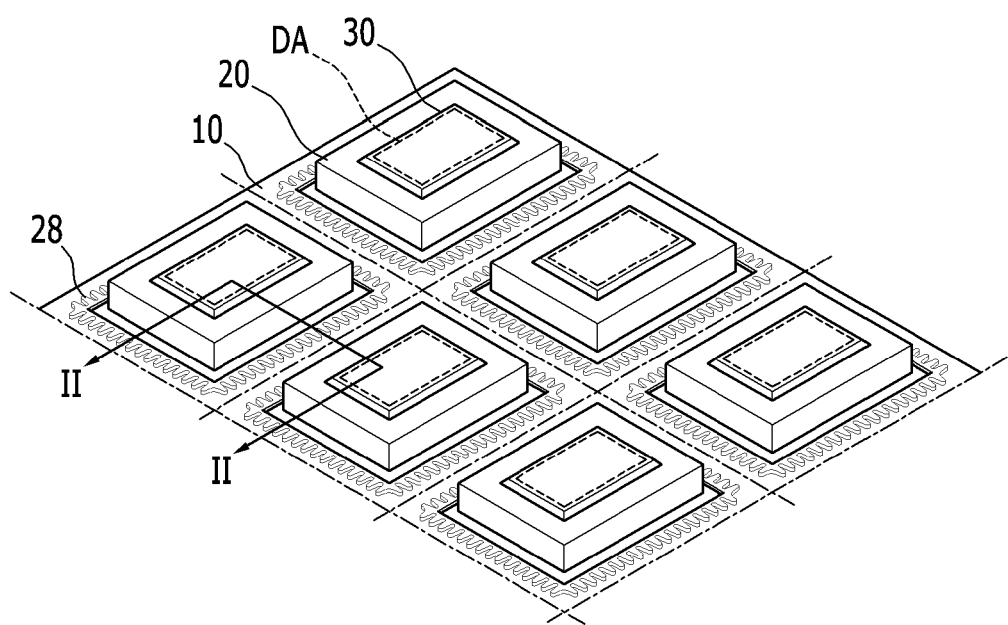
FIG. 6 is a perspective view showing another set of flexible display devices in the one-sheet state before cells thereof are cut in accordance with another exemplary embodiment.
Figure 7:
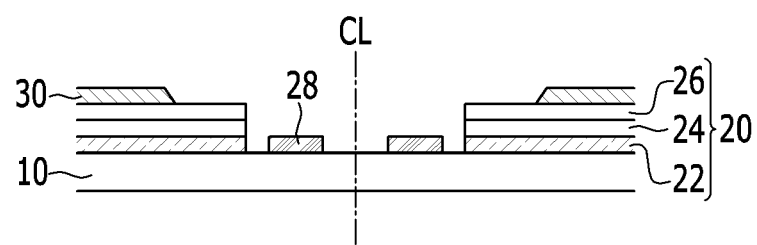
FIG. 7 is a cross-sectional view showing a structure of the flexible display device taken along a line II-II of FIG. 6.
Figure 8:
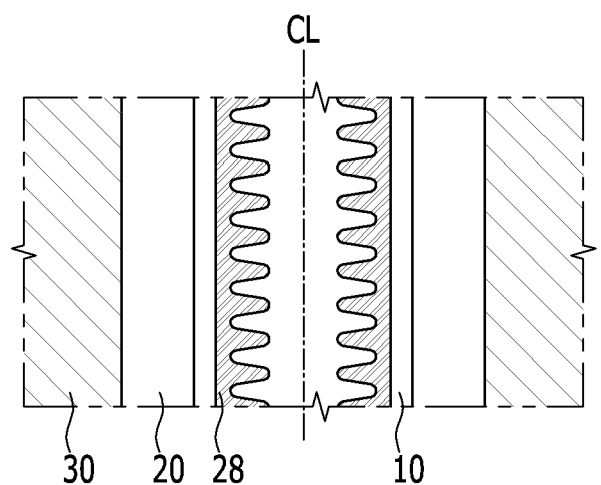
FIG. 8 is a top plan view schematically showing the flexible display devices which are in the one-sheet state before cells thereof are cut in accordance with the present exemplary embodiment.
Figure 9:
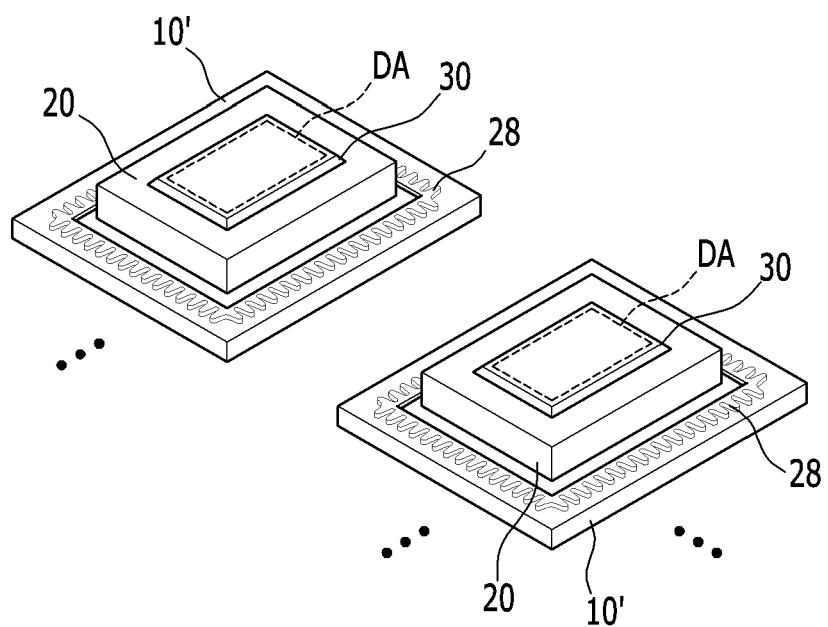
FIG. 9 is a perspective view schematically showing the individualized flexible unit display devices after cutting in accordance with the present exemplary embodiment.
Figure 10:
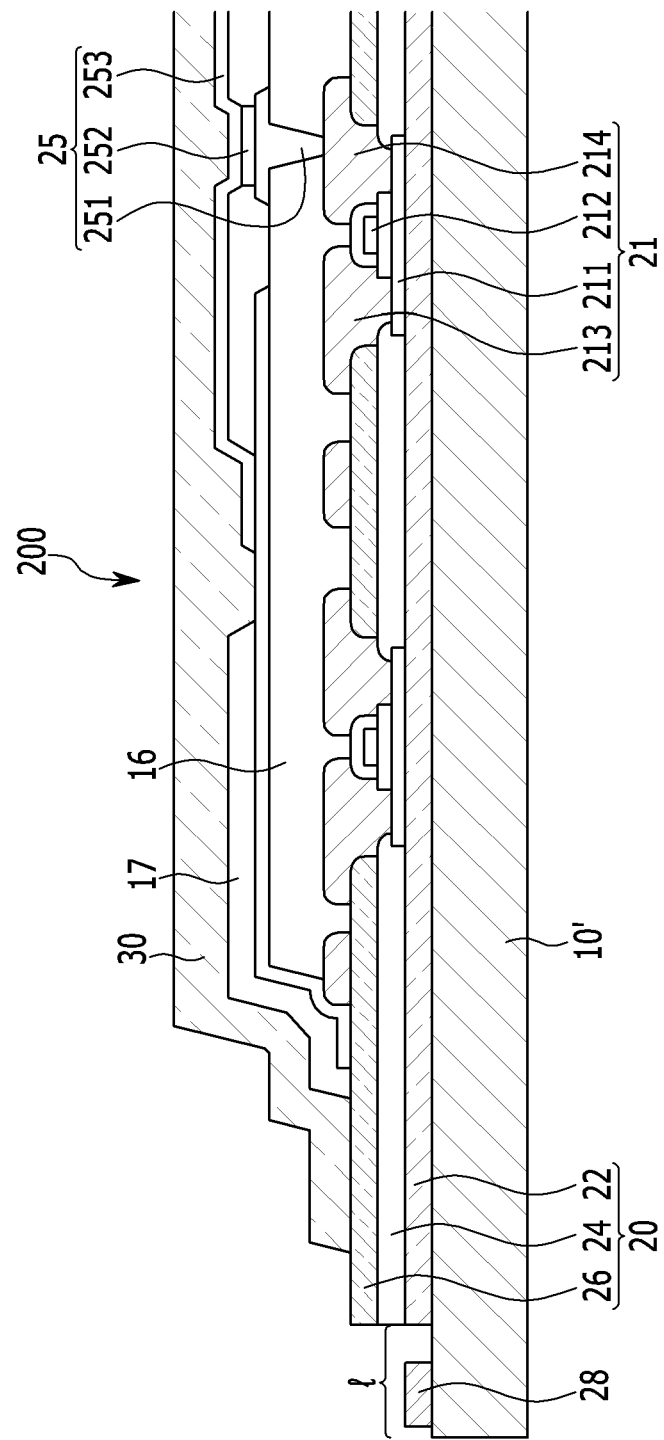
FIG. 10 is a cross-sectional view schematically showing a structure of the flexible unit display device in accordance with the present exemplary embodiment.

FIG. 6 is a perspective view showing another integrated set of flexible display devices which are in a one-sheet state before cells thereof are cut in accordance with another exemplary embodiment. FIG. 7 is a cross-sectional view of a structure of the flexible display device taken along a line II-II of FIG. 6. FIG. 8 is a top plan view schematically showing the integrated set of flexible display devices which are in a one-sheet state before cells thereof are cut in accordance with the present exemplary embodiment. FIG. 9 is a perspective view schematically showing the individualized flexible unit display devices after the cells are cut apart in accordance with the present exemplary embodiment. FIG. 10 is a cross-sectional view schematically showing a structure of the flexible unit display device in accordance with the present exemplary embodiment.

Referring to FIG. 6 to FIG. 8, cell cutting lines CL are located substantially at the center between the cell outer regions to facilitate cutting without propagation of damaging cracks and dividing of the one-sheet display device into individual unit display devices (see FIG. 9). As seen in FIGS. 6-10, a cracks-spread arresting pattern, otherwise referred to herein as a dummy pattern layer 28 is formed as an island (or plural islands) between the outer boundary lines of the cell inorganic film layers 20 and the adjacent cell cutting lines CL. As in the aforementioned exemplary embodiment, the within-cell non-display area includes the display substrate 10, the inorganic film layer 20 formed on the display substrate 10, and the thin film encapsulation layer 30 formed on the inorganic film layer 20, and the inorganic film layer 20 includes the barrier layer 22, the gate insulating layer 24, and the inter layer dielectric 26 which are sequentially stacked. On the other hand, the outside-of cells region surrounding the centralized cut line CL does not include a continuous extension of the crackable material(s) of the inorganic film layer 20 through which cracks can easily spread when straining forces are applied during the cutting process.

Although spaced apart from it, the dummy pattern layer 28 may be formed of the same material as that of the barrier layer 22, and formed on the display substrate 10 to substantially the same thickness as that of the barrier layer 22.

In the meantime, as shown in FIG. 8, the dummy pattern layer 28 may be formed in a pattern of an Rias dam (a wavy or sawtooth like boundary) with respect to a corresponding cell cutting line CL and in parallel with the side surface of the inorganic film layer 20 toward the cell region. One side of the dummy pattern layer 28 may be formed as substantially parallel to the cell outer region and the other side of the dummy pattern layer 28 may be formed as a wave-shape. In other words, the dummy pattern layer 28 is formed within the cell outer region in a shape of an energy absorbing or spread arresting dam with respect to the cell cutting line CL and the inorganic film layer 20. Further, the dummy pattern layer 28 is formed in an undulating Rias shape in which protrusions and recesses are alternately formed as extending in a direction toward the cell cutting line. Accordingly, when nascent cracks are created and they try to spread so as to be transferred to crackable materials (e.g., layer 20) of the display area, the dummy pattern layer 28 serves to absorb and buffer the spread of the straining forces. As mentioned, such straining forces may be created by impacts generated in the cell cutting process, and the straining forces may spread in various directions. However, the dummy pattern layer 28 can be configured to absorb and buffer the spread of the impact forces. Further, the energies of most of the cracks are dissipated and thus removed in the dummy pattern layer 28, and the remaining ones of the still spreading cracks are prevented from continuing their propagation in the non-crackable interval of length "l" (see FIG. 10) and of thus being transferred to the display area via crackable material since one or more portions of the inorganic film layer 20 that may otherwise serve as potential conduits for the transferring of such propagating cracks is/are removed between the dummy pattern layer 28 and the outer boundary of the cell display area.

A cross-sectional structure of the flexible unit display device shown in FIG. 10 is substantially the same as that of the exemplary embodiment of FIG. 5 except that there is additionally shown the dummy pattern layer 28 formed in the outside-the-cell region.

Figure 11:
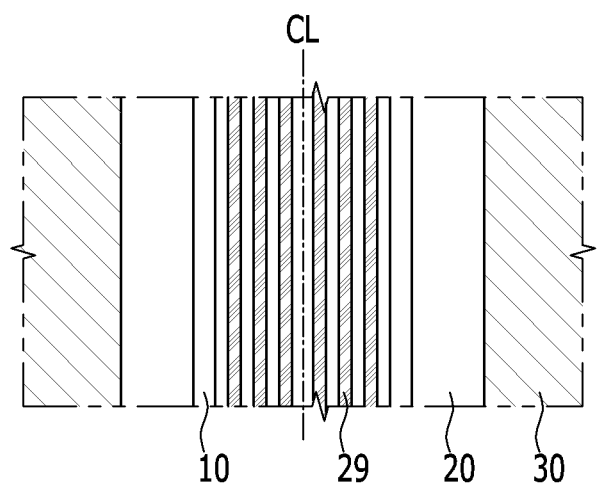
FIG. 11 is a top plan view schematically showing yet another set of flexible display devices in the one-sheet state before cells thereof are cut in accordance with yet another exemplary embodiment.
Figure 12:
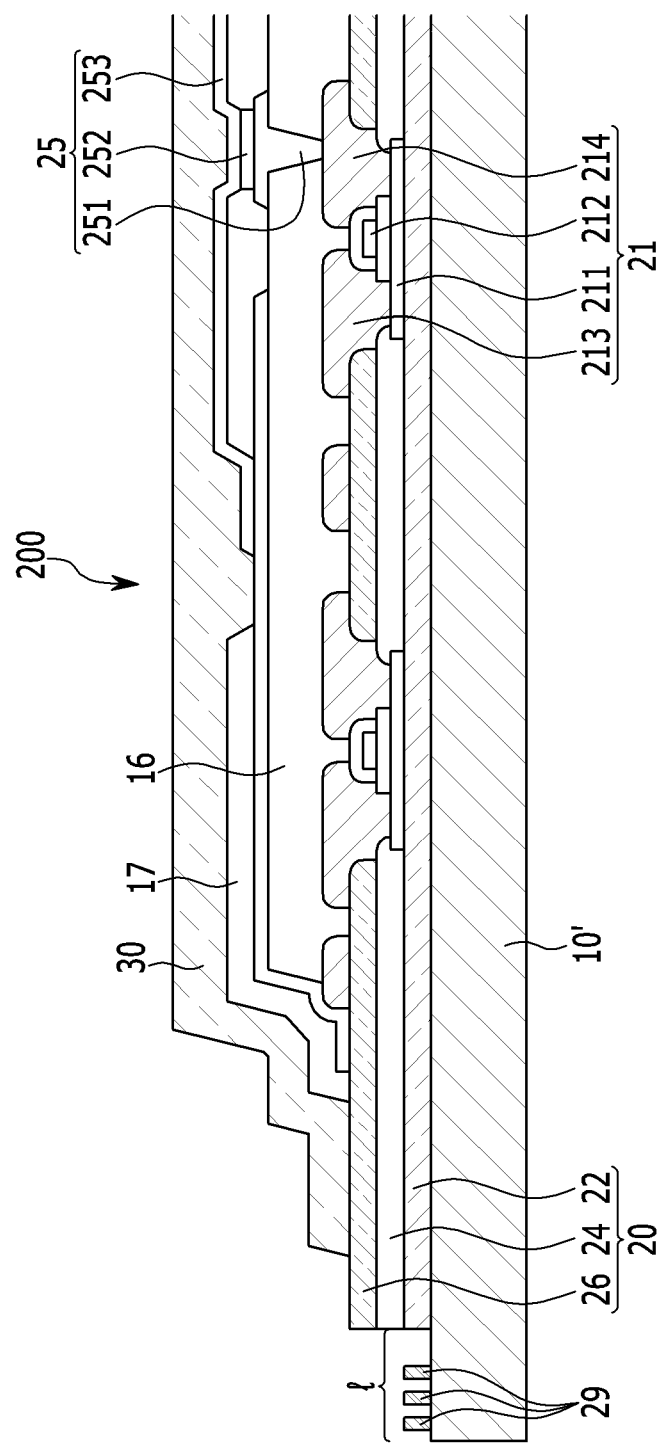
FIG. 12 is a cross-sectional view schematically showing a structure of the flexible unit display device in accordance with the present exemplary embodiment.

FIG. 11 is a plan view schematically showing yet another integrated set of flexible display devices which are in a one-sheet state before cells thereof are cut in accordance with yet another exemplary embodiment. FIG. 12 is a cross-sectional view schematically showing a structure of the flexible unit display device in accordance with the present exemplary embodiment. Referring to FIG. 11 and FIG. 12, a plurality of spaced apart dummy pattern layers 29 may be provided in the outside-the-cell region interval "$\ell$". In this case, the spaced apart dummy pattern layers 29 are disposed at a predetermined distance from each other and within the outside-the-cell region interval "$\ell$". The flexible display device of the present exemplary embodiment has substantially the same structure as that of the flexible display device of the previous exemplary embodiment except for the disposal of the dummy pattern layers 29, and thus redundant descriptions will be omitted. As in the previous exemplary embodiment, the cell cutting lines CL are located at substantially the center of the cell outer region to facilitate crackless cutting and the dividing of the one-sheet display device into individual unit display devices may proceed with reduced danger that nascent cracks will spread into and damage the adjacent display area units (DA).

In the present exemplary embodiment, it is possible to further improve the effects of buffering the impact and cutting off the spread of cracks by providing the plurality of dummy pattern layers 29 each of which can successively absorb part of the propagated cutting energy waves. The dummy pattern layers 29 shown in FIG. 11 may alternatively be formed in a wavy pattern of plural Rias dams similar to the dummy pattern layer 28 shown in FIG. 6 to FIG. 10. In other words, the dummy pattern layers 29 are formed on the cell outer region in a shape of a dam with respect to the cell cutting line CL and the inorganic film layer 20. Further, the dummy pattern layers 29 are formed in an undulating Rias shape in which protrusions and recesses are alternately formed in a direction toward the cell cutting line.

A cross-sectional structure of the flexible unit display device shown in FIG. 12 is substantially the same as those of the exemplary embodiments of FIG. 5 and FIG. 10, except for one point where the plurality of dummy pattern layers 29 are formed in the cell outer region.

As shown in FIG. 4 and FIG. 5, the flexible unit display device includes: a unit display substrate 10' formed by division and divided into a cell region and a cell outer region other than the cell region; a display unit 200 formed on the cell region of the unit display substrate 10' and including an organic light emitting elements 25 including a pixel electrode 251, an organic light emission layer 252, and a common electrode 253 which are formed on the unit display substrate 10' in that order; an inorganic film layer 20 formed at an end portion of the cell region of the unit display substrate 10'; and a thin film encapsulation layer 30 configured to cover and encapsulate the inorganic film layer 20 and the organic light emitting element 25. A cross-sectional surface of the thin film encapsulation layer 30 is located between the display unit 200 and that of the inorganic film layer 20.

The inorganic film layer 20 includes a barrier layer 22 formed at an end portion of the cell region of the unit display substrate 10', a gate insulating layer 24 formed on the barrier layer 22, and a inter layer dielectric 26 formed on the gate insulating layer 24.

As shown in FIG. 9 and FIG. 10, the flexible unit display device of the present exemplary embodiment may further include a dummy pattern layer 28 formed in the cell outer region of the unit display substrate 10'.

The dummy pattern layer 28 may be formed of the same material as that of the barrier layer 22. The dummy pattern layer 28 may be formed in a pattern of one or more Rias dams with respect to an end portion of the cell outer region.

As shown in FIG. 12, in the flexible unit display device of the present exemplary embodiment, a plurality of spaced apart dummy pattern layers 29 may be provided and disposed at a distance from each other.

Figure 13:
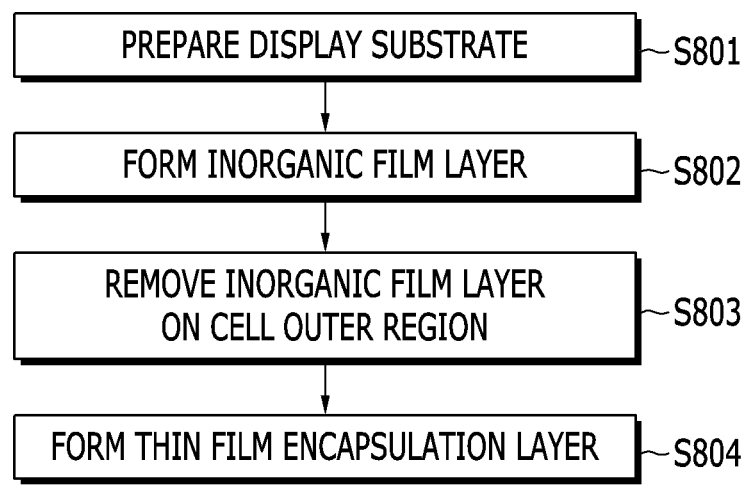
FIG. 13 is a flowchart showing a manufacturing method of the flexible display devices in accordance with an exemplary embodiment.

FIG. 13 is a flowchart showing a manufacturing method of the flexible display device in accordance with an exemplary embodiment. FIG. 14A to FIG. 14E are stepwise cross-sectional views showing the manufacturing method of the flexible display device in accordance with the present exemplary embodiment.

Figure 14A:
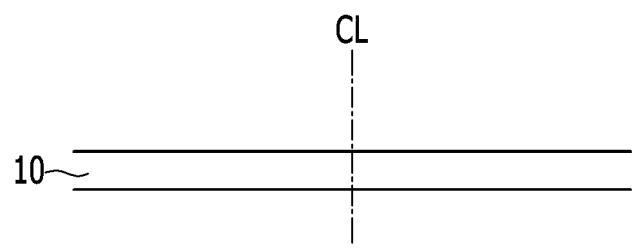
FIG. 14A to FIG. 14E are cross-sectional views successively showing the manufacturing method steps for producing the flexible display devices in accordance with the present exemplary embodiment.
Figure 14B:
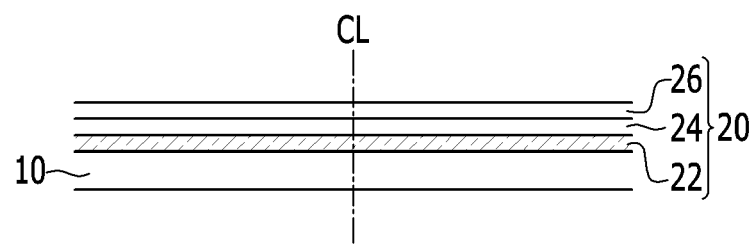
Figure 14C:
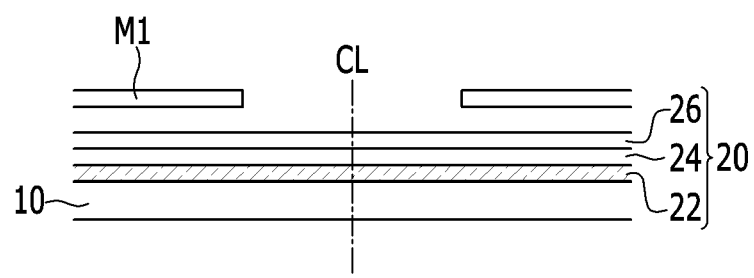
Figure 14D:
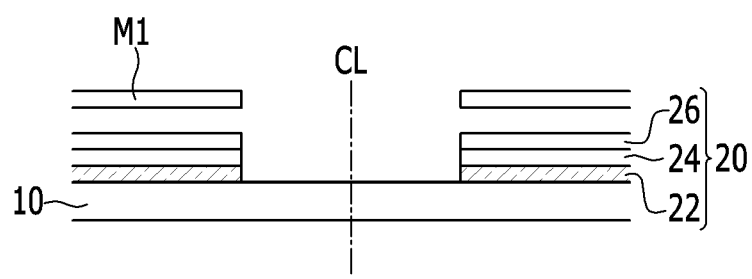
Figure 14E:
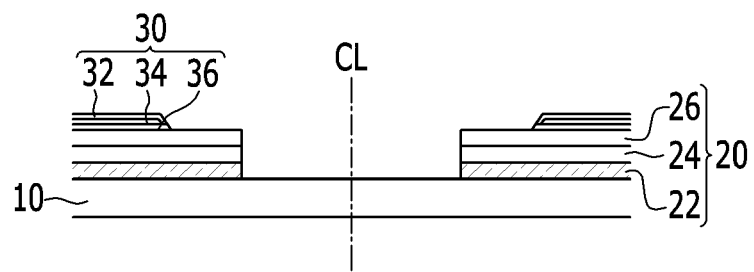

Referring to FIG. 13 to FIG. 14E, a display substrate 10 is divided into respective within-cell regions and outside-the-cell regions. Corresponding display units DA are to be formed inside the within-cell regions to each include a light emitting elements as is indicated for step S801 of FIG. 13 and the cross sectional view of FIG. 14A. Next (after the subdividing step S801), an inorganic film layer 20 is blanket formed on subdivided display substrate 10 (S802, see also FIG. 14B). Then the inorganic film layer 20 is patterned such that its material (s) is/are wholly or partially removed from the outside-the-cell regions (S803, see FIG. 14C and FIG. 14D). The inorganic film layer 20 may be removed with or after forming a thin film transistor. Then, respective interior features of the cells including the thin film encapsulation layer 30 are formed on the patterned inorganic film layer 20 of the cell region of the display substrate 10 (S804, see FIG. 14E). In this case, as described above, the thin film encapsulation layer 30 may be formed as an alternating organic and inorganic layers. As shown in FIG. 14E, in an exemplary embodiment, a configuration in which the thin film encapsulation layer 30 sequentially includes a first inorganic layer 32, a first organic layer 34, and a second inorganic layer 36 in said order from top to bottom of the display unit DA (or 200) as is shown for the given example.

The inorganic film layer 20 includes a barrier layer 22 which is formed on the cell region of the display substrate 10, a gate insulating layer 24 formed on the barrier layer 22, and a inter layer dielectric 26 formed on the gate insulating layer 24.

The step S803 of selectively removing the material(s) of the inorganic film layer 20 from within the outside-the-cell regions may include the steps of disposing an etching mask which exposes the inorganic film layer 20 formed on the cell outer region of the display substrate 10, and selectively etching the exposed inorganic film layer 20.

Further, in the step S803 of removing the inorganic film layer 20 on the cell outer region of the display substrate 10, a dummy pattern layer 28 may remain between a cell cutting line CL and the outer boundary of the inorganic film layer 20 of the within-cell region. This may be understood through stepwise cross-sectional views of FIG. 14C to FIG. 15C.

Referring to FIGS. 14C-14E and 15A-15C, a first etching mask M1 which exposes the inorganic film layer 20 formed on the cell outer region of the display substrate 10 is disposed (see FIG. 14C). Then, the gate insulating layer 24 and the inter layer dielectric 26 of the exposed inorganic film layer 20 formed on the cell outer region of the display substrate 10 are etched (first etching step). The removal of the inorganic film layer 20 may be patterned in company with forming contact hole during forming the pixel circuit.

Figure 15A:
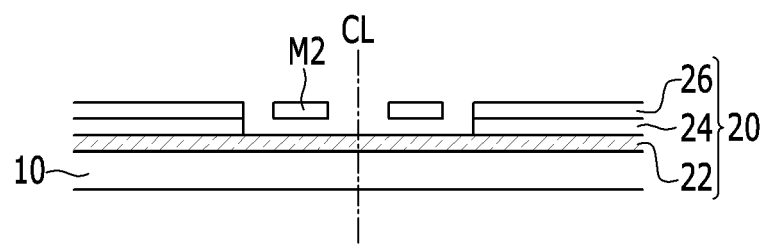
FIG. 15A to FIG. 15C are cross-sectional views successively and partially showing manufacturing method steps for producing the flexible display devices in accordance with another exemplary embodiment.
Figure 15B:
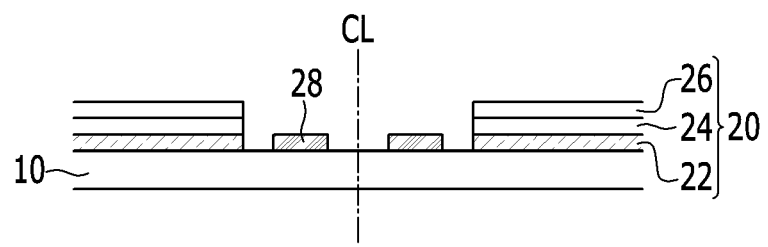

Then, a second etching mask M2 which exposes the barrier layer on the barrier layer formed on the cell outer region of the display substrate is disposed (see FIG. 15A). The exposed barrier layer 22 is then selectively etched (second etching step). In this case, the second etching mask M2 may have a shape formed depending on the shape of the desired barrier layer 22 to be etched. The second etching mask M2 may be formed in a pattern of a Rias dam with respect to the cell cutting line CL which is defined as being substantially central within the cell outer region. The second etching mask M2 may be formed in a pattern in parallel with the side surface of the inorganic film layer 20 toward the cell region The second etching mask M2 may be provided to expose a part of the barrier layer 22 formed on the cell outer region. In addition, the second etching mask M2 may be configured to define the predetermined distances separate from each other, the spaced apart dummy pattern layers 29 as a plurality of straight or wavy lines, so that the barrier layer 22 is exposed while constituting predetermined distances which are separated from each other. As in the first etching step, the removal of the barrier layer 22 may be performed in the conventional CNT process in the second etching step.

Figure 15C:
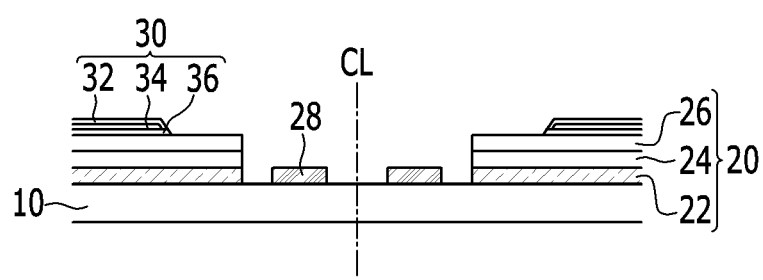

Then, the thin film encapsulation layer 30 is formed on the inorganic film layer 20 of the cell region of the display substrate 10. As described above, the thin film encapsulation layer 30 may be formed by alternately forming at least one organic layer and at least one inorganic layer. Alternatively, as shown in FIG. 15C, the configuration in which the thin film encapsulation layer 30 sequentially includes the first inorganic layer 32, the first organic layer 34, and the second inorganic layer 36 in order from top to bottom of the display unit DA (or 200) is shown as an example. This is also shown in FIG. 14E as described above.

In a one-sheet display device manufactured by using such methods, in a case in which cracks might otherwise be easily transferred to the display area by impact generated when the one-sheet flexible display device is cut into individual flexible display devices, the dummy pattern layer 28 or 29 serves to absorb and buffer the spread of impact forces and thus impede or cut off the spread of cracks, since the dummy pattern layer 28 or 29 is formed in a dam pattern on the cell outer region.

As such, by using the flexible display device in accordance with the exemplary embodiments, it is possible to cut off the transfer of cracks to the display area through the inorganic film layer due to impact generated in the cutting of a one-sheet substrate advances, and/or to remove most of the cracks in the dummy pattern layer formed in the dam pattern, and to prevent the remaining cracks from being transferred to the display area by removing the inorganic film layer serving as a passage for transferring the cracks between the dummy pattern layer 28 and the display area.

While this disclosure has been described in connection with what is presently considered to be practical exemplary embodiments, it is to be understood that the present teachings are not limited to the disclosed embodiments, but, on the contrary, are intended to cover various modifications and equivalent arrangements included within the spirit and scope of the present teachings.

What is claimed is:

1. A flexible display device, comprising:
   a display substrate which is divided into a first region corresponding to a within-display-cell region of an integrated device sheet from which the flexible display device is cut and into a second region corresponding to an outside-the-cell region of the integrated device sheet, where within the first region there is provided a display unit including a light emitting element layer;
   a patterned inorganic film layer formed to be substantially continuously present within the first region of the display substrate and to be not be at all present or to not be substantially continuously present within the second region of the display substrate; and
   a thin film encapsulation layer formed on the inorganic film layer to encapsulate the substantially continuously present portion of the inorganic film layer that is within the first region and the display unit,
   wherein an outer boundary of the thin film encapsulation layer is located between an outer boundary of the display unit and an outer boundary of the within-display-cell region portion of the inorganic film layer.

2. The flexible display device of claim 1, wherein the inorganic film layer includes:
   a barrier layer formed within the first region of the display substrate;
   a gate insulating layer formed on the barrier layer; and
   a inter layer dielectric formed on the gate insulating layer.

3. The flexible display device of claim 2, wherein the integrated device sheet from which the flexible display device is cut includes a cell cutting line that is located in the outside-the-cell region, the display substrate being cut according to the cell cutting line, and a dummy pattern layer being formed between the inorganic film layer and the cell cutting line.

4. The flexible display device of claim 3, wherein the dummy pattern layer is formed of the same material as that of the barrier layer.

5. The flexible display device of claim 3, wherein the dummy pattern layer is formed in a pattern of a Rias dam with respect to the cell cutting line.

6. The flexible display device of claim 3, wherein the dummy pattern layer includes a plurality of spaced apart dummy pattern layers.

7. A flexible unit display device obtained by dividing an integrated plurality of flexible unit display devices which are integrally formed, the flexible unit display device comprising:
   a unit display substrate divided into a within-display-cell region and an outside-the-cell region;
   a display unit formed within the within-display-cell region of the unit display substrate and including an organic light emitting element layer including a pixel electrode, an organic light emission layer, and a common electrode which are formed on the unit display substrate;
   an inorganic film layer formed to have an outer boundary ending at an end portion of, or within the within-display-cell region of the unit display substrate; and
   a thin film encapsulation layer configured to cover and encapsulate the inorganic film layer and the organic light emitting element layer,
   wherein a cross-sectional boundary surface of the thin film encapsulation layer is located between the display unit and an outer boundary of the within-display-cell portion of the inorganic film layer.

8. The flexible unit display device of claim 7, wherein the inorganic film layer includes:
   a barrier layer formed at an end portion of the cell region of the unit display substrate;
   a gate insulating layer formed on the barrier layer; and
   a inter layer dielectric formed on the gate insulating layer.

9. The flexible unit display device of claim 8, further comprising
   a dummy pattern layer formed in the outside-the-cell region of the unit display substrate.

10. The flexible unit display device of claim 9, wherein the dummy pattern layer is formed of the same material as that of the barrier layer.

11. The flexible unit display device of claim 9, wherein the dummy pattern layer is formed in a pattern of a Rias dam with respect to an end portion of the cell outer region.

12. The flexible unit display device of claim 9, wherein the dummy pattern layer includes a plurality of spaced apart dummy pattern layers which are disposed at a distance from each other.

13. A manufacturing method of a flexible display device, the manufacturing method comprising:
   preparing a display substrate which is divided into a within-cell region and a cell outer region other than the within-cell region, a display unit including a light emitting element layer being formed on the within-cell region;
   forming an inorganic film layer that blanket covers the within-cell region and the cell outer region of the display substrate;
   selectively removing parts of the inorganic film layer that are on the cell outer region of the display substrate; and
   forming a thin film encapsulation layer formed on the inorganic film layer of the within-cell region of the display substrate.

14. The manufacturing method of claim 13, wherein the inorganic film layer includes:
   a barrier layer formed on the cell region of the display substrate;
   a gate insulating layer formed on the barrier layer; and
   a inter layer dielectric formed on the gate insulating layer.

15. The manufacturing method of claim 14, wherein the removing the inorganic film layer includes:
   disposing an etching mask which exposes an inorganic film layer formed on the cell outer region of the display substrate; and
   etching the exposed inorganic film layer.

16. The manufacturing method of claim 14, wherein the removing the inorganic film layer includes:
   disposing a first etching mask which exposes an inorganic film layer formed on the cell outer region of the display substrate; and
   first etching a gate insulating layer and an inter layer dielectric of the exposed inorganic film layer formed on the cell outer region of the display substrate.

17. The manufacturing method of claim 15, wherein the removing the inorganic film layer further includes:

disposing a second etching mask which exposes the barrier layer on the barrier layer formed on the cell outer region of the display substrate; and second etching the exposed barrier layer.

18. The manufacturing method of claim 17, wherein the second etching mask is formed in a pattern of a Rias dam with respect to a cell cutting line for cutting the display substrate, which is formed on the cell outer region.

19. The manufacturing method of claim 17, wherein the second etching mask is provided to expose a part of the barrier layer formed on the cell outer region.

* * * * *